United States Patent
Lee et al.

(10) Patent No.: US 12,038,458 B2
(45) Date of Patent: Jul. 16, 2024

(54) PROBE FOR TESTING A SEMICONDUCTOR DEVICE AND A PROBE CARD INCLUDING THE SAME

(71) Applicant: SAMSUNG ELECTRONICS CO., LTD., Suwon-si (KR)

(72) Inventors: Sung Hoon Lee, Hwaseong-si (KR); Gyuyeol Kim, Hwaseong-si (KR); Yu-Kyum Kim, Hwaseong-si (KR); Hanjik Nam, Seoul (KR); Sehoon Park, Gwangju (KR); Young Jun Park, Hwaseong-si (KR); Seungwon Jeong, Yongin-si (KR); Woojun Choi, Hwaseong-si (KR)

(73) Assignees: SAMSUNG ELECTRONICS CO., LTD., Suwon-si (KR); KOREA INSTRUMENT CO., LTD., Hwaseong-si (KR)

( * ) Notice: Subject to any disclaimer, the term of this patent is extended or adjusted under 35 U.S.C. 154(b) by 328 days.

(21) Appl. No.: 17/524,841

(22) Filed: Nov. 12, 2021

(65) Prior Publication Data

US 2022/0308088 A1    Sep. 29, 2022

(30) Foreign Application Priority Data

Mar. 24, 2021 (KR) .................. 10-2021-0037942

(51) Int. Cl.
*G01R 1/073* (2006.01)
*G01R 1/04* (2006.01)
*G01R 1/067* (2006.01)

(52) U.S. Cl.
CPC ..... *G01R 1/07342* (2013.01); *G01R 1/06727* (2013.01)

(58) Field of Classification Search
CPC .......... G01R 1/04; G01R 1/067; G01R 1/073; G01R 31/00; G01R 31/02; G01R 31/26
See application file for complete search history.

(56) References Cited

U.S. PATENT DOCUMENTS 8,981,805 B2    3/2015    Okada et al.
9,015,934 B2    4/2015    Takeya
(Continued)

FOREIGN PATENT DOCUMENTS

| JP | 2002-228684 | 8/2002 |
| KR | 10-1712367 | 3/2017 |
| KR | 10-1729069 | 5/2017 |

OTHER PUBLICATIONS

Lu et al., "Enhancement of Heat Dissipation by Laser Micro Structuring for LED Module", Polymers 2018, 10, 886; doi:10.3390/polym10080886, pp. 2-13.

*Primary Examiner* — Neel D Shah
(74) *Attorney, Agent, or Firm* — F. Chau & Associates, LLC

(57) ABSTRACT

A probe for testing a semiconductor device includes a post having a plate shape and connected to a test substrate. A beam has a first end connected to the post. A tip structure is connected to a second end of the beam. The post includes a front surface having a normal line extending in a first direction. A back surface is located opposite to the front surface. Bumps are disposed on the front surface and are spaced apart from each other. The beam extends in a second direction intersecting the first direction. Each of the bumps protrudes from the front surface in the first direction by a first length.

19 Claims, 10 Drawing Sheets

(56) References Cited

U.S. PATENT DOCUMENTS

| | | | |
|---|---|---|---|
| 9,052,342 B2* | 6/2015 | Fan | G01R 1/06727 |
| 9,588,139 B2* | 3/2017 | Fan | G01R 1/06733 |
| 10,775,411 B2 | 9/2020 | Yoshioka et al. | |
| 2007/0216433 A1* | 9/2007 | Miura | G01R 1/06727 |
| | | | 324/755.07 |
| 2008/0048687 A1* | 2/2008 | Jung | G01R 3/00 |
| | | | 216/41 |
| 2009/0045831 A1* | 2/2009 | Kimoto | G01R 1/06727 |
| | | | 324/755.05 |
| 2011/0114303 A1 | 5/2011 | Rhim | |

* cited by examiner

PROBE FOR TESTING A SEMICONDUCTOR DEVICE AND A PROBE CARD INCLUDING THE SAME

CROSS-REFERENCE TO RELATED APPLICATION

This application claims priority under 35 U.S.C. § 119 to Korean Patent Application No. 10-2021-0037942, filed on. Mar. 24, 2021 in the Korean Intellectual Property Office, the disclosure of which is incorporated by reference in its entirety herein.

1. TECHNICAL FIELD

Embodiments of the present inventive concept relate to a probe for testing a semiconductor device and a probe card including the same, and more particularly, to a probe for testing a semiconductor device, capable of increasing heat dissipation performance, and a probe card including the same.

2. DISCUSSION OF RELATED ART

A semiconductor device may be manufactured by various different processes. For example, the semiconductor device may be manufactured by a photolithography process, an etching process, a deposition process, and a plating process. Electrical performance of the semiconductor device manufactured by the various processes may be tested to determine whether the semiconductor device operates properly. For example, a probe card may be used to test the semiconductor device. The probe card may include one or more tips. A probe tip may directly contact a pad of a wafer and/or a semiconductor chip to test its electrical performance.

SUMMARY

Embodiments of the present inventive concept may provide a probe for testing a semiconductor device and a probe card including the same, which are capable of increasing a heat dissipation effect by increasing a surface area of the probe to prevent a temperature of the probe from rising above a certain value.

Embodiments of the present inventive concept may also provide a probe for testing a semiconductor device and a probe card including the same, which are capable of increasing a heat dissipation effect by increasing a Reynolds number at a surface of the probe to prevent a temperature of the probe from rising above a certain value.

Embodiments of the present inventive concept may further provide a probe for testing a semiconductor device and a probe card including the same, which are capable of increasing current carrying capacity (C.C.C) of the probe.

Embodiments of the present inventive concept may further provide a probe for testing a semiconductor device and a probe card including the same, which are capable of preventing deformation of the probe.

Embodiments of the present inventive concept may further provide a probe for testing a semiconductor device and a probe card including the same, which are capable of performing a test on test pads having a fine pitch.

Embodiments of the present inventive concept may further provide a probe for testing a semiconductor device and a probe card including the same, which are capable of reducing a manufacturing cost and increasing a yield of the probe.

According to an embodiment of the present inventive concept a probe for testing a semiconductor device includes a post having a plate shape and connected to a test substrate. A beam has a first end connected to the post. A tip structure is connected to a second end of the beam. The post includes a front surface having a normal line extending in a first direction. A back surface is located opposite to the front surface. Bumps are disposed on the front surface and are spaced apart from each other. The beam extends in a second direction intersecting the first direction. Each of the bumps protrudes from the front surface in the first direction by a first length.

According to an embodiment of the present inventive concept, a probe for testing a semiconductor device includes a post having a plate shape and including a front surface and a back surface that extend perpendicular to a first direction. A beam has a first end connected to the post. The beam extends in a second direction intersecting the first direction. A tip structure extends from a second end of the beam in a third direction intersecting the first direction and the second direction. The post is electrically connected to a test substrate. The tip structure comprises a tip extending in the third direction and configured to directly contact a test pad of the semiconductor device. The beam comprises bumps that protrude in the first direction by a first length.

According to an embodiment of the present inventive concept, a probe card includes a test substrate. A plurality of probes is configured to test semiconductor device. The plurality of probes is electrically connected to the test substrate. Each of the plurality of probes comprises a plate-shaped post connected to the test substrate and including a front surface and a back surface. A beam extending laterally from the post. A tip structure connected to the beam. The post includes a plurality of heat dissipation structures disposed on the front surface.

BRIEF DESCRIPTION OF THE DRAWINGS

Embodiments of the present inventive concept will become more apparent in view of the attached drawings and accompanying detailed description.

DETAILED DESCRIPTION OF EMBODIMENTS

Figure 1:
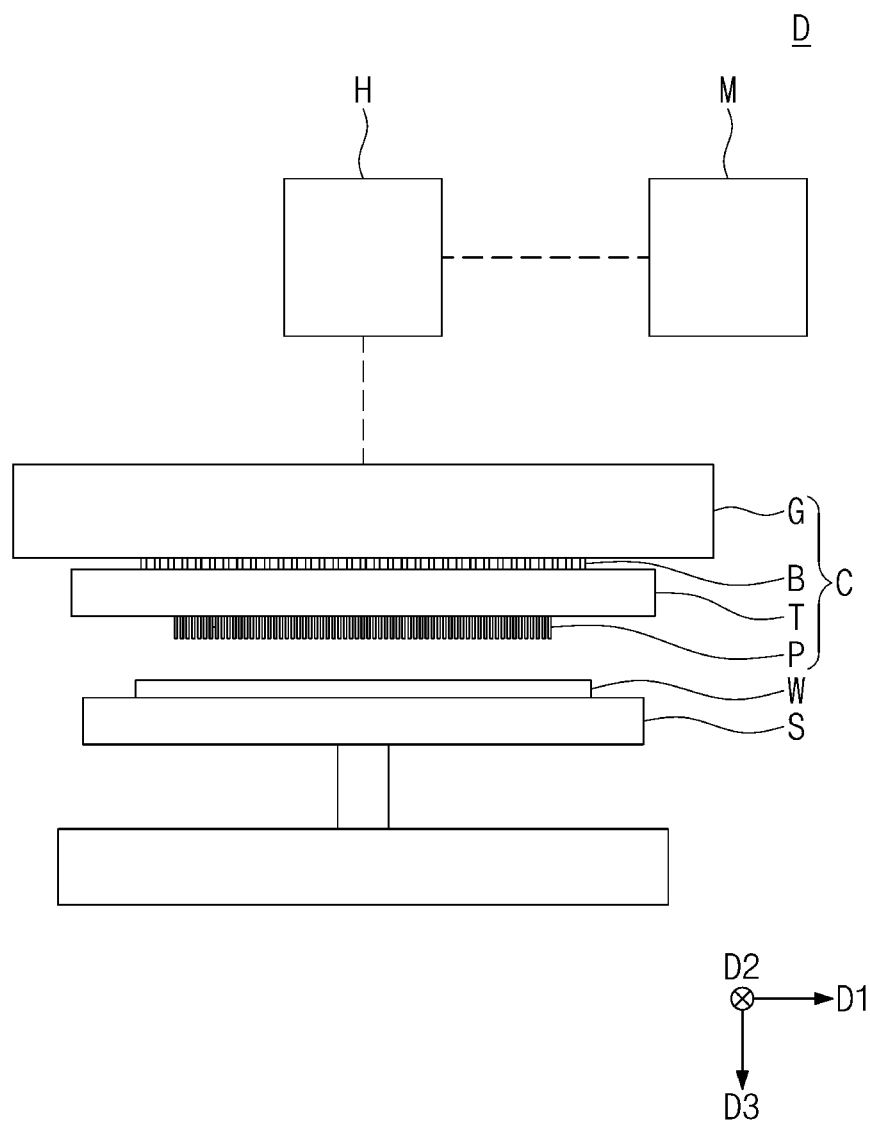
FIG. 1 is a plan view illustrating a probe card according to an embodiment of the present inventive concept.

Hereinafter, embodiments of the present inventive concept will be described in detail with reference to the accompanying drawings. The same reference numerals or the same reference designators may denote the same elements or components throughout the specification.

FIG. 1 is a schematic view illustrating a probe card according to an embodiment of the present inventive concept.

Hereinafter, reference character D' of FIG. 1 may be referred to as a first direction, and a reference character D2 intersecting the first direction D1 in FIG. 1 may be referred to as a second direction. Reference designator D3 intersecting the first and second directions D1 and D2 in FIG. 1 may be referred to as a third direction. For example, the first direction D1 and the second direction D2 may be substantially perpendicular to each other. However, embodiments of the present inventive concept are not limited thereto and the first to third directions D1 to D3 may cross each other at various different angles. For example, an angle between the first direction D1 and the second direction D2 may have another value close to 90 degrees. An angle between the third direction D3 and the first direction D1 and an angle between the third direction D3 and the second direction D2 may also be similar thereto.

Referring to FIG. 1, an apparatus D for testing a semiconductor device may be provided. The apparatus D for testing a semiconductor device may test the electrical performance of a semiconductor device. For example, the apparatus D for testing a semiconductor device may be placed into electrical contact with a pad of a wafer and/or a semiconductor chip to test whether the wafer and/or the semiconductor chip operates normally or not. The apparatus D for testing a semiconductor device may include a test body M, a test head H, a probe card C, and a stage S.

The test body M may be electrically coupled to the test head H and the probe card C. The test body M may generate an electrical signal for testing a semiconductor device. The electrical signal generated by the test body M may be transmitted to the semiconductor device through the test head H and the probe card C. In addition, the test body M may receive a signal generated from the semiconductor device through the probe card C and the test head H. The test body M may analyze the signal transmitted from the semiconductor device to determine whether the semiconductor device is defective or not.

The test head H may be electrically connected to the test body M and the probe card C. An electrical signal may be transmitted between the test body M and the probe card C through the test head H.

The probe card C may electrically connect the test body M to a test target. For example, the probe card C may electrically connect the test body M (and/or the test head H) to a test pad of a semiconductor device. In an embodiment, the probe card C may include a test substrate G, a space transformer T, and a probe P for testing a semiconductor device.

The test substrate G may include a plurality of interconnection lines disposed therein. The test substrate G may be electrically connected to the space transformer T through a connection member B. For example, in an embodiment, the connection member B may be disposed between the test substrate G and the space transformer T (e.g., in the third direction D3). The test substrate G may electrically connect the test head H to the space transformer T.

In an embodiment, the space transformer T may be detachably coupled to the test substrate G. The space transformer T may be electrically connected to the test substrate G through the connection member B. The space transformer T may electrically connect the test substrate C to the probe P for testing a semiconductor device. In an embodiment, a conductive via and a redistribution line may be disposed in the space transformer T. The probe P for testing a semiconductor device may be electrically connected to the connection member B through the conductive via and the redistribution line of the space transformer T. The space transformer T may transform or convert a small pitch of a plurality of the probes P for testing a semiconductor device into a wide pitch of the connection member B.

The probe P for testing a semiconductor device may be placed in direct contact with the test pad. The probe P for testing a semiconductor device may be placed in direct contact with the test pad to apply a test power to a wafer W and/or a semiconductor chip through the test pad. A test may be performed on the wafer W and/or the semiconductor chip by the test power provided from the probe P for testing a semiconductor device. The probe P for testing a semiconductor device may be coupled to the space transformer T. For example, the probe P for testing a semiconductor device may be electrically connected to the test substrate G through the space transformer T. However, embodiments of the present inventive concept are not limited thereto. For example, in some embodiments, the probe P for testing, a semiconductor device may be directly connected to the test substrate G and the space transformer T may not be included in the apparatus D. Hereinafter, the probe P for testing a semiconductor device, which is connected to the space transformer T, will be described as an example for the purposes of ease and convenience in explanation. In an embodiment, the probe P for testing a semiconductor device may be provided in plurality. The plurality of probes P for testing a semiconductor device may be spaced apart from each other in the first direction D1. For example, the plurality of probes P for testing a semiconductor device may be coupled to the space transformer T while being spaced apart from each other M the first direction D1. For example, an upper portion of each of the probes P may directly contact a lower portion of the space transformer T. Each of the plurality of probes P for testing a semiconductor device may be placed into direct contact with each of a plurality of the test pads. Hereinafter, one of the probes P for testing a semiconductor device will be mainly described for the purposes of ease and convenience of explanation. The probe P for testing a semiconductor device will be described later in more detail with reference to FIGS. 2 to 10.

A semiconductor device corresponding to the test target may be disposed on the stage S. For example, the wafer W may be disposed on the stage S. The wafer W may be tested by the probe card C while being supported by the stage S. However, embodiments of the present inventive concept are not limited thereto. For example, in some embodiments, an individually sawed semiconductor chip may be disposed on the stage S and then may be tested.

Figure 2:
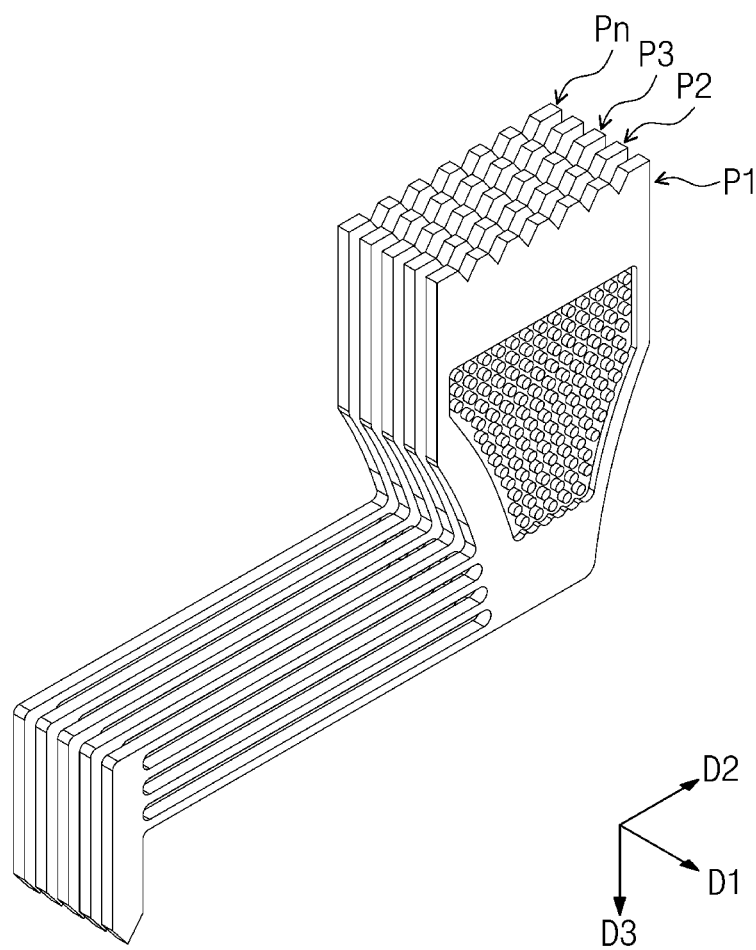
FIG. 2 is a perspective view illustrating probes for testing a semiconductor device, according to an embodiment of the present inventive concept.

FIG. 2 is a perspective view illustrating probes for testing a semiconductor device, according to some embodiments of the present inventive concept.

Referring to FIG. 2, the apparatus D may include a plurality of probes P1, P2, P3, . . . and Pn for testing a semiconductor device. For example, as described with reference to FIG. 1, the plurality of probes P1, P2, P3, . . . and Pn for testing a semiconductor device may be connected to the test substrate G and/or the space transformer T. The plurality of probes P1, P2, P3, . . . and Pn for testing a semiconductor device may be spaced apart from each other in the first direction D1. In an embodiment, a distance in the first direction D1 between adjacent two of the plurality of probes P1, P2, P3, . . . and Pn for testing a semiconductor device may be in a range of about 50 µm to about 70 µm. For example, the distance in the first direction D1 between two adjacent probes of the plurality of probes P1, P2, P3, . . . and Pn for testing a semiconductor device may be in a range of about 60 µm to about 65 µm. However, embodiments of the present inventive concept are not limited thereto and the distance between two adjacent probes of the plurality of probes P1, P2, P3, . . . and Pn may vary, such as based on a distance between the test pads and the direction that the probes are spaced apart may vary. Hereinafter, components of a single probe for testing a semiconductor device will be described in detail with reference to the following drawings.

Figure 3:
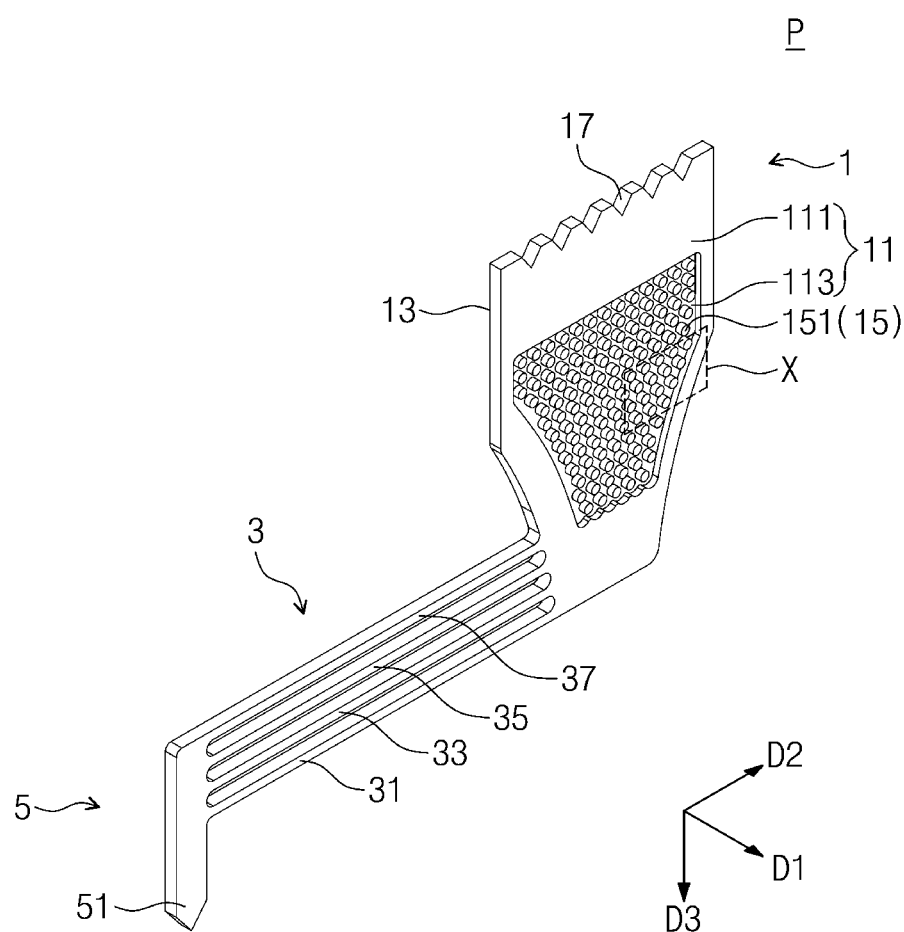
FIG. 3 is a perspective view illustrating a probe for testing a semiconductor device, according to a embodiment of the present inventive concept.
Figure 4:
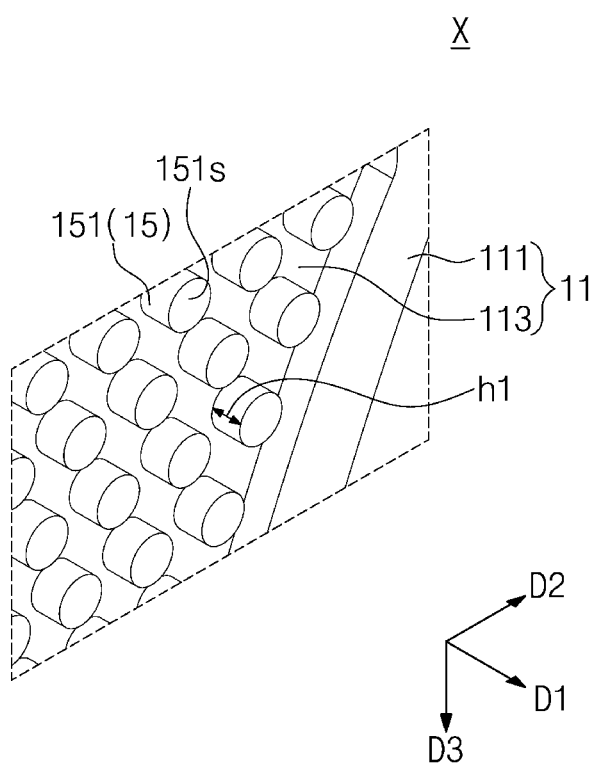
FIG. 4 is an enlarged perspective view of a region 'X' of FIG. 3, according to an embodiment of the present inventive concept.
Figure 5:
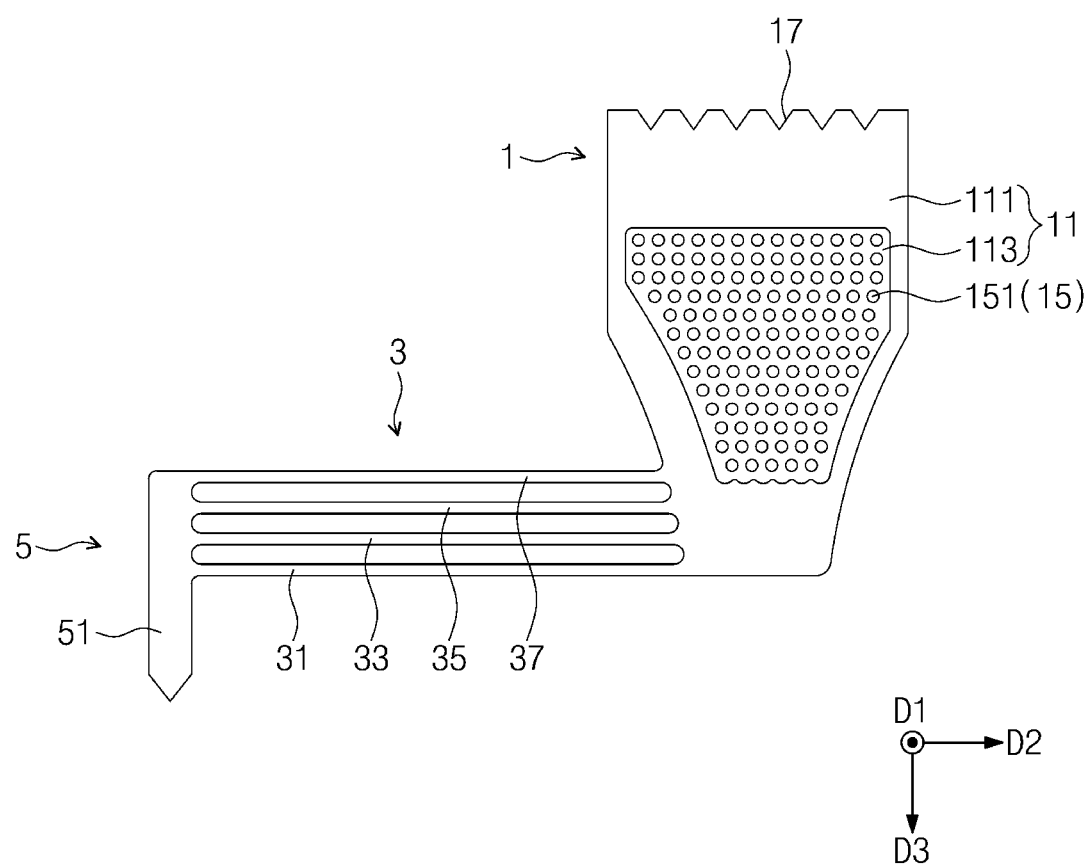
FIG. 5 is a front elevational view illustrating a probe for testing a semiconductor device, according to an embodiment of the present inventive concept.

FIG. 3 is a perspective view illustrating a probe for testing a semiconductor device, according to an embodiment of the present inventive concept, FIG. 4 is an enlarged perspective view of a region 'X' of FIG. 3, and FIG. 5 is a front elevational view illustrating a probe for testing a semiconductor device, according to embodiments of the present inventive concept.

Referring to FIGS. 3 and 5, a probe P for testing a semiconductor device may have a cantilever structure. In some embodiments, the probe P for testing a semiconductor device may include a post 1, a beam 3, and a tip structure 5.

The post 1 may be connected to the test substrate G (see FIG. 1). For example, in an embodiment, the post 1 may be electrically connected to the test substrate G through the space transformer T (see FIG. 1). In an embodiment, the post 1 may have a plate shape. For example, the post 1 may have a plate shape extending in a plane defined in the second direction D2 and the third direction D3. In some embodiments, the post 1 may have a plate shape which becomes narrower toward the third direction D3. In an embodiment, the post 1 may include a metal material. For example, the post 1 may include nickel-cobalt (Ni—Co). However, embodiments of the present inventive concept are not limited thereto. The post 1 may include a front surface 11, a back surface 13, a connection surface 17, and a heat dissipation structure 15.

The front surface 11 may include a surface extending substantially in a plane defined in the second direction D2 and the third direction D3. The front surface 11 may be perpendicular to the first direction D1. For example, a normal line of the front surface 11 may extend in the first direction D1. The front surface 11 may include a first surface 111 and a second surface 113. The first surface 111 may be a reference surface of the front surface 11. The second surface 113 may be recessed from the first surface 111 towards the back surface 13 by a certain depth (e.g., a first depth). For example, the second surface 113 may be recessed from the first surface 111 by a first depth in a direction opposite to the first direction D1. Thus, the second surface 113 may also be referred to as a recessed surface. In some embodiments, the first surface 111 may be substantially parallel to the second surface 113. The heat dissipation structure 15 may be disposed on the front surface 11. For example, the heat dissipation structure 15 may be disposed on the second surface 113. This will be described later in more detail.

The back surface 13 may be positioned opposite to the front surface 11 (e.g., in a direction opposite to the first direction D1). In an embodiment, the back surface 13 may be substantially parallel to the front surface 11. For example, the back surface 13 may also include a surface extending substantially in the second direction D2 and the third direction D3. The back surface 13 may be perpendicular to the first direction D1. For example, a normal line of the back surface 13 may extend in the opposite direction to the first direction D1. In an embodiment, the back surface 13 may also include a recessed surface, similar to the front surface 11. For example, a portion of the back surface 13 may be recessed toward the front surface 11 in the first direction D1 by a certain depth. In an embodiment, the recessed portion of the back surface 13 may be recessed toward the front surface 11 by the first depth. However, embodiments of the present inventive concept are not limited thereto. Thus, the back surface 13 and the front surface 11 may have symmetrical shapes. A heat dissipation structure 15 may be disposed on the recessed surface of the back surface 13. This will be described later in more detail.

The connection surface 17 may be a top surface of the post 1 (e.g., in a direction opposite to the third direction D3). The connection surface 17 may connect the front surface 11 and the back surface 13. In an embodiment, the connection surface 17 may include an uneven surface. However, embodiments of the present inventive concept are not limited thereto. The connection surface 17 may be connected to the space transformer T or the test substrate G. For example, in an embodiment, the connection surface 17 may be bonded to the space transformer T or the test substrate G by a solder bonding process. However, embodiments of the present inventive concept are not limited thereto.

The heat dissipation structure 15 may be disposed on the front surface 11 and/or the back surface 13. Hereinafter, an embodiment in which the heat dissipation structure 15 is disposed on the front surface 11 will be mainly described for the purposes of ease and convenience in explanation. The heat dissipation structure 15 may include at least one shape protruding from the front surface 11 in the first direction D1 by a certain length (e.g., a first length). For example, the heat dissipation structure 15 may include at least one bump 151. However, embodiments of the present inventive concept are not limited thereto. For example, in certain embodiments, the heat dissipation structure 15 may include a through-hole shape extending entirely through the post 1 from the front surface 11 toward the back surface 13. The heat dissipation structure 15 having the through-hole shape will be described later with reference to FIG. 6. As shown in the embodiment of FIG. 4, the bump 151 may be provided in plurality. In an embodiment, the plurality of bumps 151 may be spaced apart from each other in the second direction D2 and/or the third direction D3. Hereinafter, a single bump 151 will be mainly described for the purposes of ease and convenience in explanation. In some embodiments, the bump 151 may be disposed directly on the second surface 113. For example, the bump 151 may protrude from the second surface 113 in the first direction D1 by a certain length (e.g., a first length). The shape of the bump 151 will be described later in more detail with reference to FIG. 4.

The beam 3 may be connected to the post 1. For example, the beam 3 may extend substantially in the second direction D2 and may have a first end that is coupled to the post 1, such as a lower surface of the post 1 (e.g., in the third direction D3). For example, the beam 3 may extend laterally from the post 1. When external force is applied to the beam 3 having a cantilever shape, the beam 3 may be bent in the third direction D3. In an embodiment, the beam 3 may include a metal material. For example, the beam 3 may include nickel-cobalt (Ni—Co). However, embodiments of the present inventive concept are not limited thereto. In an embodiment, the beam 3 may be provided in plurality. The plurality of beams 3 may be spaced apart from each other in the third direction D3. For example, in an embodiment, the beams 3 may include a first beam 31, a second beam 33, a third beam 35, and a fourth beam 37. Each of the first to fourth beams 31, 33, 35 and 37 may extend longitudinally substantially in the second direction D2. The first to fourth beams 31, 33, 35 and 37 may be spaced apart from each other in the third direction D3. In the present embodiment, the beam 3 include a plurality of beams each having a straight line shape is illustrated. However, embodiments of the present inventive concept are not limited thereto. For example, in some embodiments, at least one of the first to fourth beams 31, 33, 35 and 37 may be a curved beam including a wave shape. For example, in an embodiment, the first beam 31 may be a straight beam having the straight shape, and each of the second to fourth beams 33, 35 and 37 may be the curved beam having the wave shape. However, embodiments of the present inventive concept are not limited thereto. Due to the structure of the curved beam, the beam 3 may be smoothly bent in the third direction D3 by the external force. In the embodiment shown in FIG. 3, the beam 3 includes four beams. However, embodiments of the present inventive concept are not limited thereto and the number of beams 3 may vary. For example, in some embodiments, a single beam 3 may be provided, or various other numbers of beams 3 two or greater may be provided.

The tip structure 5 may be coupled to the beam 3. For example, the tip structure 5 may be coupled to a second end of the beam 3 that is opposite to the first end of the beam 3. The tip structure 5 may extend substantially in the third direction D3. The tip structure 5 may include a tip 51. The tip 51 may extend from the beam 3 substantially in the third direction D3. For example, the tip 51 may extend from the second end of the beam 3 that is farthest away from the post 1 in the third direction D3. In an embodiment, as shown in FIG. 3, a width of the tip 51 (e.g., length in the second direction D2) may become narrower towards the third direction D3 and a lowermost surface of the tip 51 may have the smallest width.

Referring to FIG. 4, a front surface of the bump 151 may be referred to as a protruding surface 151s. The protruding surface 151s may include a flat surface. In some embodiments, the protruding surface 151s may be substantially parallel to the front surface 11 of the post 1. A height h1 of the bump 151 may correspond to a distance between the second surface 113 of the post 1 and the protruding surface 151s (e.g., in the first direction D1). For example, the height h1 of the bump 151 may be substantially equal or similar to a distance between the second surface 113 and the first surface 111. For example, the protruding surface 151s may be located in substantially the same plane as the first surface 111. However, embodiments of the present inventive concept are not limited thereto. For example, in an embodiment, the height h1 of the bump 151 may be less than the distance between the second surface 113 and the first surface 111. For example, the distance between the protruding surface 151s and the second surface 113 may be less than the distance between the first surface 111 and the second surface 113. Thus, a distance between the protruding surface 151s and the back surface 13 (see FIG. 3) may be less than a distance between the first surface 111 and the back surface 13. However, embodiments of the present inventive concept are not limited thereto. For example, the height of each of the bumps 151 may have various different values. However, the protruding surface 151s may be small enough to avoid contacting a surface of an adjacent probe (see FIG. 2) for testing a semiconductor device.

In some embodiments, the bump 151 may have a cylindrical shape (e.g., in a plane defined in the second and third directions D2, D3). However, embodiments of the present inventive concept are not limited thereto. For example, in certain embodiments, the bump 151 may have various other shapes (e.g., in a plane defined in the second and third directions D2, D3). Examples of the bump 151 having shapes other than a cylindrical shape will be described later in detail with reference to FIGS. 8 to 10.

The probe for testing a semiconductor device and the probe card including the same according to embodiments of the present inventive concept may have an increased surface area of the probe. Thus, heat generated from the probe may be efficiently released to the outside. For example, a heat dissipation effect of the probe may be increased. Thus, even though the probe is heated by Joule's heat, it is possible to prevent a temperature of the probe from rising above a certain level. In addition, since the temperature rise of the probe is prevented, the current carrying capacity (C.C.C) of the probe may be increased. Thus, performance of the probe may be increased.

The probe for testing a semiconductor device and the probe card including the same according to an embodiment of the present inventive concept may have an increased Reynolds number at the surface of the probe due to the bump formed on the surface of the probe. For example, the Reynolds number of a gas flowing along the rough surface of the probe may be increased. Thus, the gas flowing near the surface of the probe may form turbulence. As a result, the gas may flow rapidly near the surface of the probe. When the gas flows rapidly near the surface of the probe, the heat generated from the probe may be dispersed or dissipated rapidly. For example, the heat dissipation effect of the probe may be increased to prevent excessive temperature rise of the probe.

According to an embodiment of the present inventive concept, the probe for testing a semiconductor device and the probe card including the same have an increased C.C.C of the probe. Therefore, the probe may not be deformed even though an overcurrent and a continuous current stress occur in the probe. For example, even though a strong current continuously flows through the probe, the temperature of the probe may not rise above a certain level. Thus, a burnt phenomenon and/or a depression phenomenon of the probe may be prevented. As a result, the performance of the probe may be increased.

According to an embodiment of the present inventive concept, the probe for testing a semiconductor device and the probe card including the same may have an increased heat dissipation effect of the probe. Therefore, the temperature of the probe may be lowered without increasing a size of the probe. Thus, the probe may efficiently and effectively perform a test on test pads having a finer pitch. In addition, since the heat dissipation effect of the probe is increased by changing its structure, the temperature of the probe may be lowered without changing a material of the probe. Thus, a manufacturing cost of the probe may be reduced, and a yield of the probe may be increased.

Figure 6:
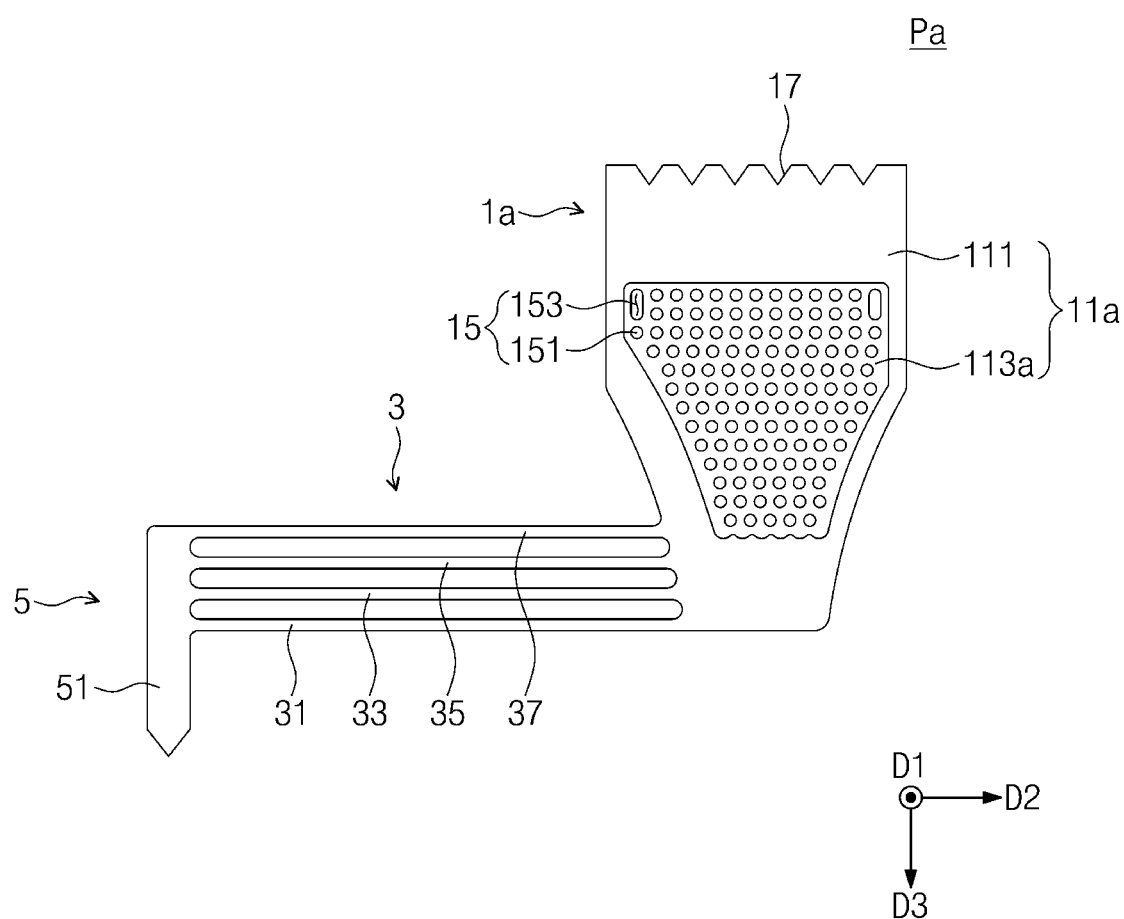
FIG. 6 is a front elevational view illustrating a probe for testing a semiconductor device, according to an embodiment of the present inventive concept.

FIG. 6 is a front view illustrating a probe for testing a semiconductor device, according to an embodiment of the present inventive concept.

Hereinafter, the descriptions of the same or similar features as mentioned with reference to FIGS. 1 to 5 will be omitted for the purposes of ease and convenience of explanation.

Referring to FIG. 6, a heat dissipation structure 15 of a probe Pa for testing a semiconductor device may include a through-hole 153 in addition to the bump 151. The through-hole 153 may be a hole which is provided in the post 1a and extends through a front surface 11a and the back surface 13 of the post 1a (see FIG. 3). The through-hole 153 may extend longitudinally in the first direction D1. For example, the through-hole 153 may penetrate the post 1a in the first direction D1. The through-hole 153 may be provided in a second surface 113a of the post 1a and may penetrate an entirety of the thickness of the second surface 113a of the post 1a. Thus, the through-hole 153 may be a hole connecting the second surface 113a and the back surface 13. In an embodiment, the through-hole 153 may be provided in plurality. For example, two through-holes 153 may be provided in one post 1a. However, embodiments of the present inventive concept are not limited thereto and the number of the through-holes 153 may be three or more in some embodiments.

According to an embodiment of the present inventive concept, the probe for testing a semiconductor device and the probe card including the same may have an increased heat dissipation effect of the probe due to the at least one through-hole 153 formed in the probe. Thus, the embodiment of FIG. 6 may obtain effects similar to or greater than those of the probe for testing a semiconductor device and the probe card including the same, described with reference to the embodiments of FIGS. 1 to 5.

Figure 7:
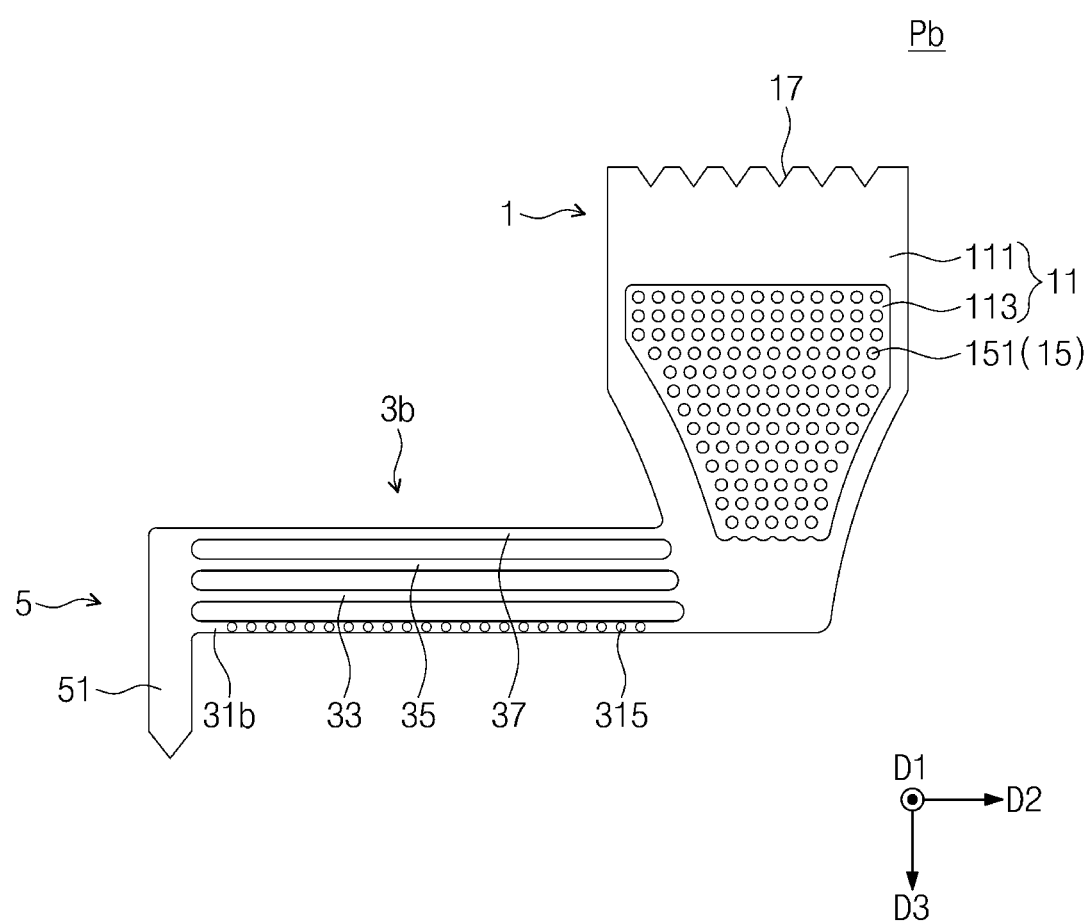
FIG. 7 is a front elevational view illustrating a probe for testing a semiconductor device, according to an embodiment of the present inventive concept.

FIG. 7 is a front view illustrating a probe for testing a semiconductor device, according to an embodiment of the present inventive concept.

Hereinafter, the descriptions of the same or similar features as mentioned with reference to FIGS. 1 to 6 will be omitted for the purposes of ease and convenience in explanation.

Referring to FIG. 7, a beam 3b of a probe Pb for testing a semiconductor device may include a heat dissipation structure 315. For example, the beam 3b may include a heat dissipation structure 315 comprising a bump. However, embodiments of the present is concept are not limited thereto. For convenience of explanation, the heat dissipation structure 315 will be referred to as a bump herein. The bump 315 may protrude in the first direction D1 by a certain length (e.g., a second length). In an embodiment, the bump 315 of the beam 3b may be provided in plurality. The plurality of bumps 315 may be spaced apart from each other the second direction D2. In FIG. 7, the bump 315 is disposed on only a first beam 31b. However, embodiments of the present inventive concept are not limited thereto. For example, one or more of the other beams 3b, such as the second beam 33, the third beam 35 and/or the fourth beam 37 may also include the bump 315. Additionally, the plurality of bumps 315 may be spaced apart from each other in various different directions along each bump 315, such as when the bump 315 is curved.

Figure 8:
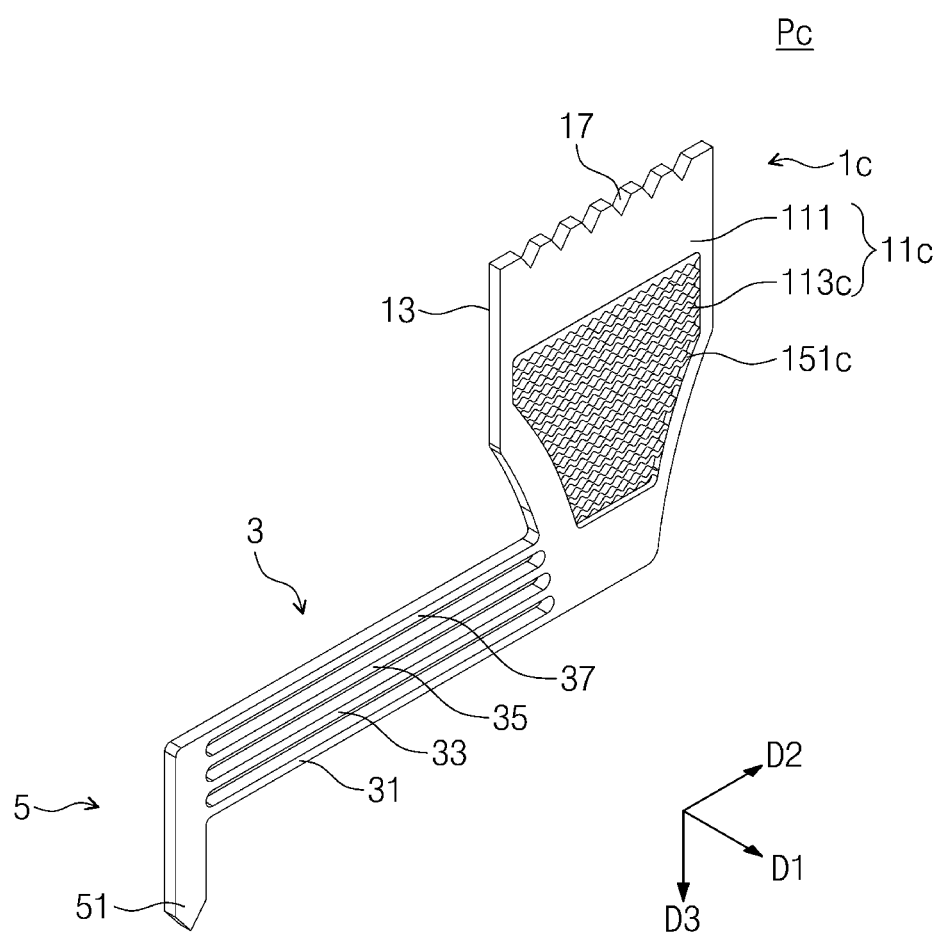
FIG. 8 is a perspective view illustrating a probe for testing a semiconductor device, according to an embodiment of the present inventive concept.

FIG. 8 is a perspective view illustrating a probe for testing a semiconductor device, according to an embodiment of the present inventive concept.

Hereinafter, the descriptions of the same or similar features as mentioned with reference to FIGS. 1 to 7 will be omitted for the purposes of ease and convenience in explanation.

Referring to FIG. 8, a post 1c of a probe Pc for testing a semiconductor device may include a bump 151c. The bump 151c may be disposed on a front surface 11c. For example, the bump 151c may be disposed on a second surface 113c of the post 1c. The bump 151c may protrude from the second surface 113c in the first direction D1. However, unlike the embodiments of FIGS. 1 to 7, a shape of the bump 151c may not be a cylindrical shape. For example, in an embodiment, the bump 151c may have a wave shape as illustrated in FIG. 8 and may extend in the second direction D2. However, embodiments of the present inventive concept are not limited thereto. In an embodiment, the bump 151c may be provided in plurality. The plurality of bumps 151c may be spaced apart from each other in the third direction D3. However, the bumps 151c having the wave shape may be variously arranged along the second surface 113c.

Figure 9:
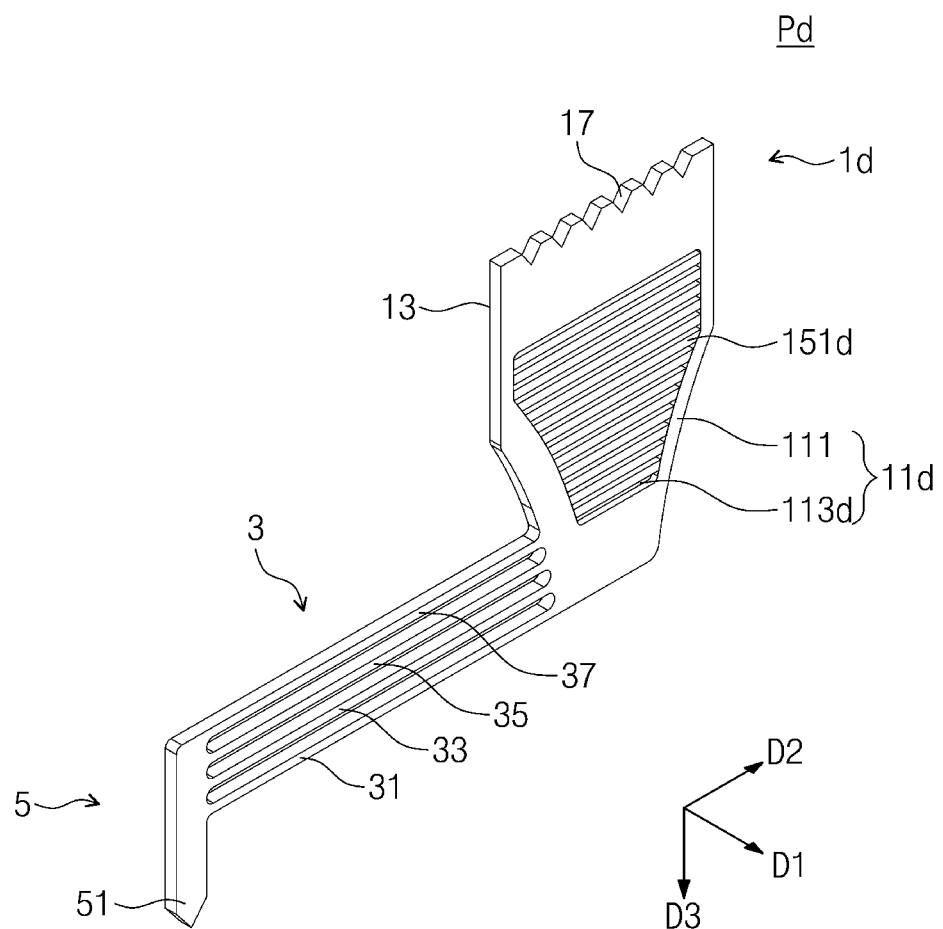
FIG. 9 is a perspective view illustrating a probe for testing a semiconductor device, according to an embodiment of the present inventive concept.

FIG. 9 is a perspective view illustrating a probe for testing a semiconductor device, according to an embodiment of the present inventive concept.

Hereinafter, the descriptions of the same car similar features as mentioned with reference to FIGS. 1 to 8 will be omitted for the purposes of ease and convenience in explanation.

Referring to FIG. 9, a post 1d of a probe Pd for testing a semiconductor device may include a bump 151d. The bump 151d may be disposed on a front surface 11d. For example, the bump 151d may be disposed on a second surface 113d of the post 1d. The bump 151d may protrude from the second surface 113d in the first direction D1. However, unlike the embodiments of FIGS. 1 to 7, a shape of the bump 151d may not be a cylindrical shape. For example, in an embodiment, the bump 151d may have a straight shape as illustrated in FIG. 9 and may extend longitudinally in the second direction D2. In some embodiments, the bump 151d may be provided in plurality. The plurality of bumps 151d may be spaced apart from each other in the third direction D3. However, embodiments of the present inventive concept are not limited thereto and the at least one bump 151d having a straight shape may extend in other directions, such as the third direction D3 in some embodiments.

Figure 10:
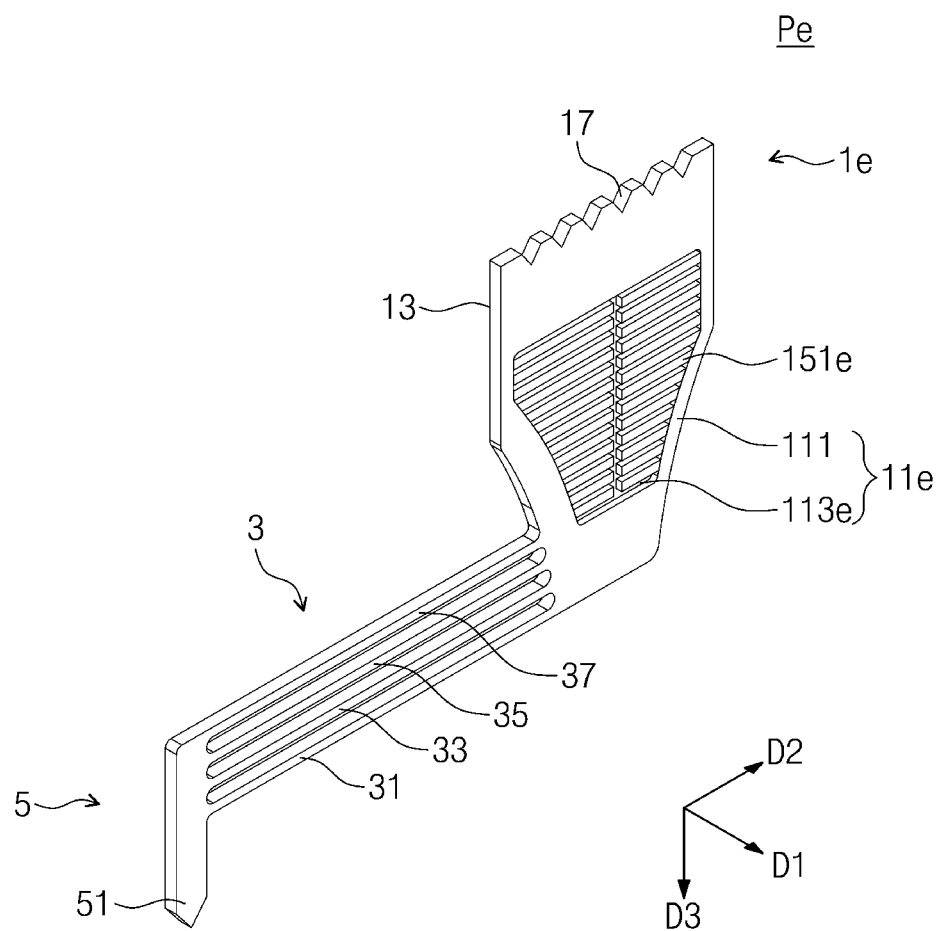
FIG. 10 is a perspective view illustrating a probe for testing a semiconductor device, according to an embodiment of the present inventive concept.

FIG. 10 is a perspective view illustrating a probe for testing a semiconductor device, according to an embodiment of the present inventive concept.

Hereinafter, the descriptions of the same or similar features as mentioned with reference to FIGS. 1 to 9 will be omitted for the purposes of ease and convenience in explanation.

Referring to FIG. 10, a post 1e of a probe Pe for testing a semiconductor device may include a bump 151e. The bump 151e may be disposed on a front surface 11e. For example, the bump 151e may be disposed on a second surface 113e of the post 1e. The bump 151e may protrude from the second surface 113e in the first direction D1. However, unlike the embodiments of FIGS. 1 to 7, a shape of the bump 151e may not be the cylindrical shape. For example, the bump 151e may have a straight shape as illustrated in FIG. 10 and may extend longitudinally substantially in the second direction D2. In addition, unlike the bump described with reference to the embodiment of FIG. 9, the middle of the bump 151e of FIG. 10 may be broken or cut. In an embodiment, as shown in FIG. 9, the bump 151e may be provided in plurality. The plurality of bumps 151e may be spaced apart from each other in the third direction D3.

However, embodiments of the present inventive concept are not limited thereto and the bump may have at least one of other various shapes and/or arrangements.

According to an embodiment of the present inventive concept, the probe for testing a semiconductor device and the probe card including the same may have an increased heat dissipation effect of the probe by increasing the surface area of the probe, thereby preventing a temperature of the probe from rising above a certain value.

According to an embodiment of the present inventive concept, the probe for testing a semiconductor device and the probe card including the same may have an increased heat dissipation effect of the probe by increasing the Reynolds number at the surface of the probe, thereby preventing a temperature of the probe from rising above a certain value.

According to an embodiment of the present inventive concept, the probe for testing a semiconductor device and the probe card including the same may have an increased current carrying capacity (C.C.C) of the probe.

According to an embodiment of the present inventive concept, the probe for testing a semiconductor device and the probe card including the same may prevent deformation of the probe.

According to an embodiment of the present inventive concept, the probe for testing a semiconductor device and the probe card including the same may perform a test on the test pads having a fine pitch.

According to an embodiment of the present inventive concept, the probe for testing a semiconductor device and the probe card including the same may reduce the manufacturing cost, and increase the yield of the probe.

While the present inventive concept have been described with reference to embodiments thereof, it will be apparent to those skilled in the art that various changes and modifications may be made without departing from the spirits and scopes of the present inventive concept. Therefore, it should be understood that the above embodiments are not limiting, but illustrative.

What is claimed is:

1. A probe for testing a semiconductor device, the probe comprising:
   a post having a plate shape and connected to a test substrate;
   a beam having a first end connected to the post; and
   a tip structure connected to a second end of the beam,
   wherein the post comprises:
   a front surface having a normal line extending in a first direction;
   a back surface located opposite to the front surface; and
   a heat dissipation structure comprising bumps disposed on the front surface and spaced apart from each other,
   wherein the beam extends in a second direction intersecting the first direction, and
   wherein each of the bumps protrudes from the front surface in the first direction by a first length, wherein the bumps release heat generated from the probe.

2. The probe of claim 1, wherein each of the bumps has a cylindrical shape.

3. The probe of claim 1, wherein the post further comprises a through-hole extending through the post from the front surface to the back surface.

4. The probe of claim 1, wherein the front surface comprises:
   a first surface; and
   a second surface recessed from the first surface towards the back surface by a first depth,
   wherein each of the bumps is disposed on the second surface.

5. The probe of claim 4, wherein each of the bumps has a protruding surface positioned substantially in a same plane as the first surface.

6. The probe of claim 4, wherein:
   each of the bumps has a protruding surface that is parallel to the first surface; and
   wherein a distance between the protruding surface and the back surface is less than a distance between the first surface and the back surface.

7. The probe of claim 1, wherein:
   the tip structure extends from the beam in a third direction intersecting the first direction and the second direction,
   wherein the tip structure comprises a tip extending in the third direction and configured to directly contact a test pad of the semiconductor device.

8. The probe of claim 1, wherein the beam includes a plurality of beams that are spaced apart from each other.

9. The probe of claim 8, wherein the plurality of beams comprises:
   at least one straight beam extending in a straight line in the second direction; and
   at least one curved beam extending in a wave shape in the second direction.

10. The probe of claim 1, wherein the post and the beam include nickel-cobalt (Ni—Co).

11. A probe for testing a semiconductor device, the probe comprising:
    a post having a plate shape and including a front surface and a back surface that extend perpendicular to a first direction;
    a beam having a first end connected to the post, the beam extending in a second direction intersecting the first direction; and
    a tip structure extending from a second end of the beam in a third direction intersecting the first direction and the second direction,
    wherein the post is electrically connected to a test substrate,
    wherein the tip structure comprises a tip extending in the third direction and configured to directly contact a test pad of the semiconductor device, and
    wherein the beam comprises a heat dissipating structure comprising bumps that protrude in the first direction by a first length, wherein the bumps release heat generated from the probe.

12. The probe of claim 11, wherein:
    the beam includes a plurality of beams,
    wherein the bumps are included on at least one of the plurality of beams.

13. The probe of claim 12, wherein the plurality of beams comprises:
    at least one straight beam extending in a straight line in the second direction; and
    a plurality of curved beams extending in a wave shape in the second direction.

14. The probe of claim 11, wherein the post and the beam include nickel-cobalt (Ni—Co).

15. A probe card comprising:
    a test substrate; and
    a plurality of probes configured to test a semiconductor device, the plurality of probes is electrically connected to the test substrate,
    wherein each of the plurality of probes comprises:
    a plate-shaped post connected to the test substrate and including a front surface and a back surface;
    a beam extending laterally from the post; and
    a tip structure connected to the beam, wherein the post includes a plurality of heat dissipation structures disposed on the front surface, at least one of the plurality of heat dissipation structures comprises a bump protruding from the front surface by a first length.

16. The probe card of claim 15, wherein:

the front surface faces a first direction, wherein the plurality of probes are connected to the test substrate and are spaced apart from each other in the first direction.

17. The probe card of claim 16, wherein the front surface comprises:

a first surface; and a second surface recessed from the first surface towards the back surface by a first depth, wherein the bump is disposed on the second surface.

18. The probe card of claim 17, wherein a protruding surface of the bump is parallel to the first surface, wherein a distance between the protruding surface and the back surface is less than or equal to a distance between the first surface and the back surface.

19. The probe card of claim 15, wherein at least one of the plurality of heat dissipation structures comprises a through-hole extending through the plate-shaped post from the front surface to the back surface.

* * * * *